United States Patent
Weddle et al.

(10) Patent No.: US 6,370,495 B1
(45) Date of Patent: Apr. 9, 2002

(54) METHOD AND APPARATUS FOR SIMULATING A STORAGE COMPONENT

(75) Inventors: Eugene Weddle; Roy Wen, both of San Jose; Bernard E. Stewart, Fremont; Singh Shashij, San Jose, all of CA (US)

(73) Assignee: Oak Technology, Sunnyvale, CA (US)

( * ) Notice: Subject to any disclaimer, the term of this patent is extended or adjusted under 35 U.S.C. 154(b) by 0 days.

(21) Appl. No.: 09/241,578

(22) Filed: Feb. 2, 1999

(Under 37 CFR 1.47)

(51) Int. Cl.[7] .............................................. G06F 17/50
(52) U.S. Cl. ............................. 703/19; 703/15; 716/6; 714/814
(58) Field of Search .............................. 703/14–16, 19; 716/5, 6; 714/814, 815

(56) References Cited

U.S. PATENT DOCUMENTS

| 5,446,748 A | * | 8/1995 | Hasebe et al. | 714/814 |
| 5,826,061 A | * | 10/1998 | Walp | 716/6 |
| 5,943,489 A | * | 8/1999 | Shiratori | 703/16 |

OTHER PUBLICATIONS

Acosta et al., "Modeling of Real Bistables in VHDL", Proc. EURO–DAC '93, European Design Automation Conference, pp. 460–465, Sep. 1993.*

Velev et al, "Incorporating Timing Constraints in the Efficient Memory Model for Symbolic Ternary Simulation", Proc. International Design Conf. on Computer Design: VLSI in Computers and Processors, pp. 400–406, Oct. 1998.*

Van Noije et al., "Precise Final State Determination of Mismatched CMOS Latches", IEEE Journal of Solid–State Circuits, vol. 30, Issue5, pp. 607–611, May 1995.*

Van Noije et al., "Metastability Behavior of Mismatched CMOS Flip–Flops Using State Diagram Analysis", Proc. IEEE Custom Integrated Circuits Conf., pp. 27.7.1–27.7.4, May 1993.*

* cited by examiner

Primary Examiner—Kevin J. Teska
Assistant Examiner—Douglas W. Sergent
(74) Attorney, Agent, or Firm—Bobbie Truong; John Schipper

(57) ABSTRACT

The present invention simulates the behavior of a storage component by first determining whether a timing violation has occurred for the storage component. If one or more timing violations is detected, then an x (indicating uncertainty) is reflected at the output of the storage component. This x is maintained at the output of the storage component for a predetermined number of timing units. After the predetermined number of timing units has expired, the output of the storage component is changed from x to a certain value, such as a logical 1 or a logical 0. By changing the output to a certain value, the present invention prevents the x at the output of the storage component from indefinitely propagating to other components in the circuit. This in turn prevents large numbers of x's from appearing in the simulation results provided to the designer. Instead, values that are certain will appear in the results. Because these values are certain, they can be used by the designer to determine whether the rest of the circuit operated properly.

16 Claims, 6 Drawing Sheets

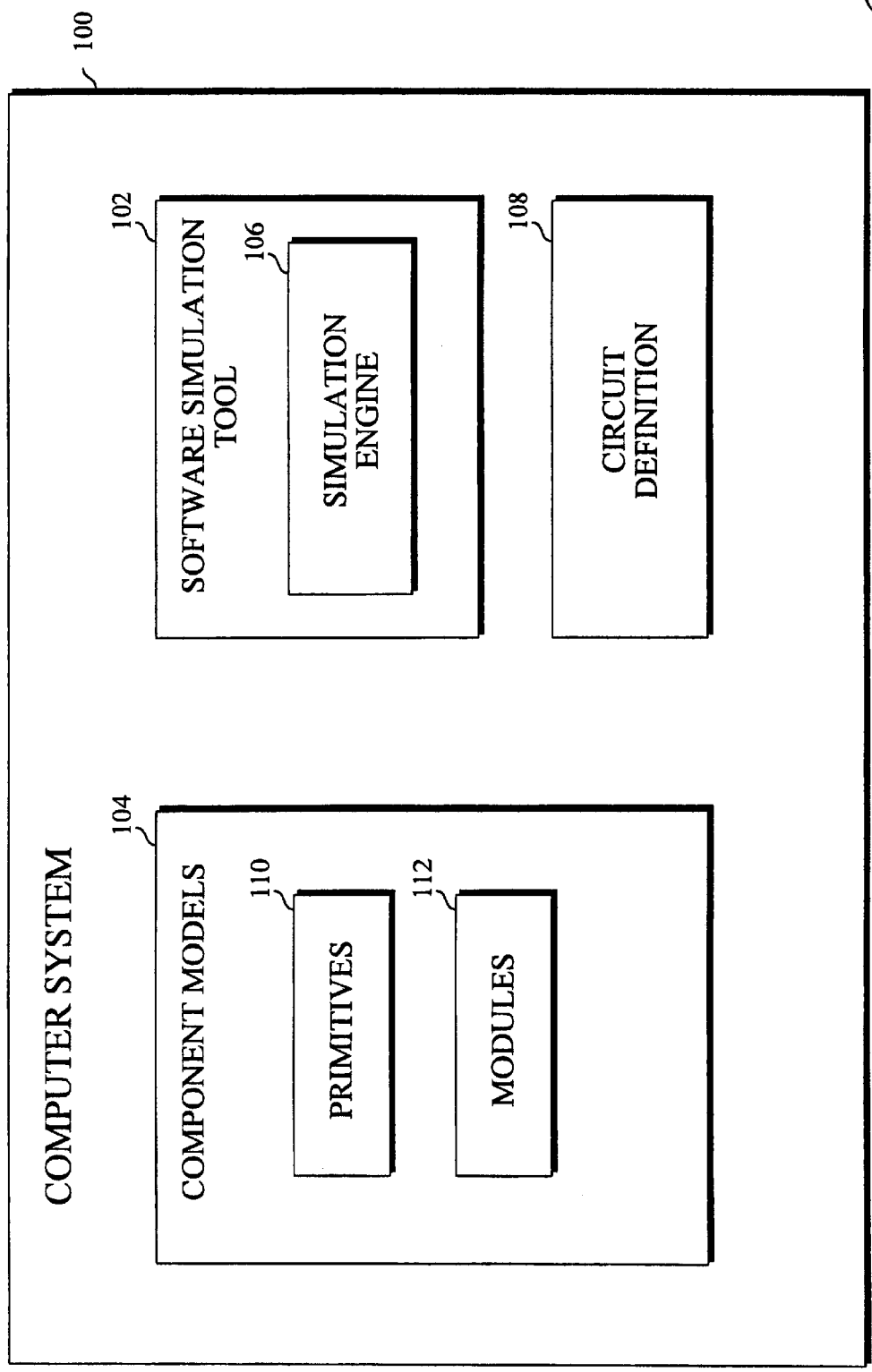

```
primitive p_ffrs (q, d, cp, r, s, notifier)
    output q; reg q;                                                    110
    input d, cp, r, s,notifier;
    table
// rw . 981221 . change "notifier" from ?'s to 0's
// rw . 981221 . notifier=1 => qt+1=x
// rw/gene . 981221-981228 . notifier=(10) => qt+1=d(1, 0 or x)
//     d      cp      r      s       no:    qt:    qt+1
       1      (01)    0      0       0 :    ? :    1; // clocked data
       1      (01)    0      x       0 :    ? :    1; // pessimism
       1      ?       0      x       0 :    1 :    1; // pessimism
       0      0       0      x       0 :    1 :    1; // pessimism
       0      x       0      (?x)    0 :    1 :    1; // pessimism
       0      1       0      (?x)    0 :    1 :    1; // pessimism
       x      0       0      x       0 :    1 :    1; // pessimism
       x      x       0      (?x)    0 :    1 :    1; // pessimism
       x      1       0      (?x)    0 :    1 :    1; // pessimism
       0      (01)    0      0       0 :    ? :    0; // clocked data
       0      (01)    x      0       0 :    ? :    0; // pessimism
       0      ?       x      0       0 :    0 :    0; // pessimism
       1      0       x      0       0 :    0 :    0; // pessimism
       1      x       (?x)   0       0 :    0 :    0; // pessimism
       1      1       (?x)   0       0 :    0 :    0; // pessimism:
       x      0       x      0       0 :    0 :    0; // pessimism
       x      x       (?x)   0       0 :    0 :    0; // pessimism
       x      1       (?x)   0       0 :    0 :    0; // pessimism
       1      (x1)    0      0       0 :    1 :    1; // reducing pessimism
       0      (x1)    0      0       0 :    0 :    0;
       1      (0x)    0      0       0 :    1 :    1;
       0      (0x)    0      0       0 :    0 :    0;
       0      1       (10)   0       0 :    0 :    0; // Gene 4/27/98
       1      1       0      (10)    0 :    1 :    1; // Gene 4/27/98
       ?      ?       1      ?       0 :    ? :    0; // asynchronous clear
       ?      ?       1      ?       x :    ? :    0; // asynchronous clear
       ?      ?       0      1       0 :    ? :    1; // asynchronous set
       ?      ?       0      1       x :    ? :    1; // asynchronous set
       ?      (?0)    ?      ?       0 :    ? :    -; // ignore falling clock
       ?      (1x)    ?      ?       0 :    ? :    -; // ignore falling clock
       *      ?       ?      ?       0 :    ? :    -; // ignore data edges
       ?      ?       (?0)   0       0 :    ? :    -; // ignore the edges on
       ?      ?       ?      (?0)    0 :    ? :    -; // set and clear
       ?      ?       ?      ?       1 :    ? :    x;
       1      ?       ?      ?       (10):  ? :    1;
       0      ?       ?      ?       (10):  ? :    0;
       x      ?       ?      ?       (10):  ? :    x;
    endtable
endprimitive
```

*Fig. 2*

```
`celldefine
// d flip-flops with set and clear (2x)
// q = !cdn ? 0 : !sdn ? 1 : rising(cp) ? d : 'p';qn = !sdn ? 0 :
// !cdn ? 1 : rising(cp) ? !d : 'p'
module dfbrb2 (q, qn, cdn, cp, d, sdn);
```

A:
```
    output q;
    output qn;
    input cdn;
    input cp;
    input d;
    input sdn;
    reg notifier;
    not _i0 (_n1,sdn);
    not _i1 (_n2,cdn);
    p_ffrs _i2 (net1,d,cp,_n2,_n1,notifier);
    or I1 (net2,cdn,sdn);
    and I2 (q,net1,net2);
    not I3 (net3,net1);
    and I4 (qn,net3,net2);
```

B:
```
    // gene & royw x-propagation (BEGIN) ------------------------------
```
B1:
```
    initial begin // get rid of initial X's
            notifier = 0 ;
    end
```
B2:
```
    always @(posedge notifier) begin // get rid of X propagation
            #4 notifier=0 ;
    end
    // gene & royw x-propagation (END) --------------------------------
```

C:
```
    buf chk18(shcheckcpcdnlh, d&sdn);
    buf chk19(shcheckcpsdnlh, cdn&~d);
    buf chk20(shcheckcpdlh, cdn&sdn);
    `ifdef setuphold
            reg cp_lh_d_hl_dref;
            reg cp_lh_d_lh_dref;
            reg cp_lh_d_hl_ddata;
            reg cp_lh_d_lh_ddata;
    `endif
    specify
            $width(negedge cdn,1,0,notifier);
            $width(negedge cp,1,0,notifier);
            $width(negedge sdn,1,0,notifier);
            $width(posedge cp,1,0,notifier);
```

Fig. 3A

| Fig. 3A |
| Fig. 3B |

```
       ⋮
                (cdn => q) = (0.194, 0.440);
                (cdn => qn) = (0.957, 0.957);
                (cp => q) = (0.787, 0.760);
                (cp => qn) = (0.509, 0.464);
                (sdn => q) = (1.011, 1.011);
                (sdn => qn) = (0.481, 0.519);
           `ifdef setuphold
                $setuphold(posedge cp,posedge d, 0, 0,
                        notifier,shcheckcpdlh === 1'b1, shcheckcpdlh === 1'b1,
                        cp_lh_d_lh_dref, cp_lh_d_lh_ddata);
                $setuphold(posedge cp,negedge d, 0, 0,
                        notifier,shcheckcpdlh === 1'b1, shcheckcpdlh === 1'b1,
                        cp_lh_d_hl_dref, cp_lh_d_hl_ddata);
                $hold(posedge cdn,posedge sdn,0,notifier);
                $hold(posedge cp,posedge sdn,0,notifier);
                $setup(posedge sdn,posedge cdn,0,notifier);
                $setup(posedge sdn &&& shcheckcpsdnlh === 1'b1,posedge cp,0,notifier);
C               $hold(posedge sdn,posedge cdn,0,notifier);
                $hold(posedge cp,posedge cdn,0,notifier);
                $setup(posedge cdn,posedge sdn,0,notifier);
                $setup(posedge cdn &&& shcheckcpcdnlh === 1'b1,posedge cp,0,notifier);
           `else
                $hold(posedge cdn,posedge sdn,0,notifier);
                $hold(posedge cp,negedge d &&& shcheckcpdlh === 1'b1,0,notifier);
                $hold(posedge cp,posedge cdn &&& d,0,notifier);
                $hold(posedge cp,posedge d &&& shcheckcpdlh === 1'b1,0,notifier);
                $hold(posedge cp,posedge sdn &&& ~d,0,notifier);
                $hold(posedge sdn,posedge cdn,0,notifier);
                $setup(negedge d &&& shcheckcpdlh === 1'b1,posedge cp,0,notifier);
                $setup(posedge cdn &&& shcheckcpcdnlh === 1'b1,posedge cp,0,notifier);
                $setup(posedge cdn,posedge sdn,0,notifier);
                $setup(posedge d &&& shcheckcpdlh === 1'b1,posedge cp,0,notifier);
                $setup(posedge sdn &&& shcheckcpsdnlh === 1'b1,posedge cp,0,notifier);
                $setup(posedge sdn,posedge cdn,0,notifier);
           `endif
     endspecify
     endmodule
     `endcelldefine
     // verigen patch-level 1.124 02/19/97 14:04:47
```

*Fig. 3B*

METHOD AND APPARATUS FOR SIMULATING A STORAGE COMPONENT

FIELD OF THE INVENTION

This invention relates generally to simulation systems and more particularly to a method and apparatus for simulating a storage component.

BACKGROUND OF THE INVENTION

Software simulation tools are used on a regular basis by circuit designers to to test and to verify the functionality of their circuits. With a software simulation tool, a designer defines a circuit using a definitional language, such as Verilog XL. This definition includes a specification of the components in the circuit, as well as the connections between the various components. Once the circuit is defined, the designer invokes the simulation engine of the tool to interpret the definition of the circuit provided by the designer, and to simulate the behavior of the circuit to provide to the designer a set of results. Thereafter, it is up to the designer to determine, based upon the results, whether the circuit worked as he intended. The major advantage of using a software simulation tool is that it enables a circuit design to be tested without ever having to physically build the circuit. By not building the circuit, a significant amount of time and resources is often saved. With simulation tools, the results are only as good as the models used to represent the circuit components. If the models are flawed, the results will also be flawed. Because of this, it is imperative that the components be modeled accurately.

One type of component that appears frequently in circuits, and hence is simulated frequently, is that of a storage component. As used herein, the term storage component refers to any component that is capable of storing one or more bits of data, including a flip-flop, a latch, a register, etc. Unlike combinational logic components (such as AND gates and OR gates), a storage component may have some stringent timing requirements that must be met in order to operate properly. For example, there may be a certain amount of setup time that is required before the application of a data signal in order for the data signal to be stored in the storage component. There may also be a certain hold time during which a signal must be maintained in order for the storage component to perform the desired function. These timing requirements, referred to as setup and hold times, are checked by the simulation engine of the simulation tool to determine whether there are any timing violations in the circuit. If a timing violation is detected, the simulation engine provides an indication of the timing violation, thereby notifying the designer that there may be an error in the circuit. These timing requirement checks are important in all circuits, but they are especially important in circuits having both synchronous and asynchronous components. With asynchronous components, events can occur at any time. Because of the unpredictability of the timing of events, some of the timing requirements of the storage components may not be met. If timing violations result from the interaction between the synchronous and asynchronous components, the designer should be alerted. Under the current storage component model, if a timing violation occurs for a storage component, the storage component outputs an x, indicating that due to the timing violation, the output of the storage component is uncertain. This x output serves two purposes. First, it indicates the true state of affairs. Because of the timing violation, it is truly not known whether the output of the storage component is a logical 1 or a logical 0. Second, the x output provides an indication to the designer that a timing violation has occurred. This serves to alert the designer to the presence of the timing violation.

In theory, the use of the x output is sound. In practice, however, the x output may lead to unusable results. To elaborate, whenever a circuit component, whether it be a combinational logic component or another type of component, experiences an x at one of its inputs, it will provide an x at its output. This makes logical sense because if an input is uncertain, the output is also uncertain. Given this rule, if a storage component outputs an x in response to a timing violation, it will cause whatever components that receive the x as input to also output an x. In turn, any components that receive the x outputs from those components will also output an x, and any components that receive the x outputs from those other components will also output an x, and so on. This process of propagating the x, referred to as fanout, continues until all components that depend directly or indirectly upon the output of the storage component have received and propagated the x. If the number of components that depend upon the output of the storage component is large, the fanout can be quite substantial, and if the fanout is substantial, the designer will receive from the simulation engine a set of results having a large number of x's. X's, because they represent uncertainty, provide very little information as to the operation of the circuit. With x's as the outputs, the designer cannot determine whether the circuit operated properly. Hence, such results are almost useless to the designer.

As this discussion shows, the current model for storage components can lead to useless simulation results. Since such results are clearly undesirable, an improved mechanism for simulating storage components is needed.

SUMMARY OF THE INVENTION

In light of the shortcomings of the prior art, the present invention provides an improved mechanism for simulating storage components. The present invention is based, at least partially, upon the observation that while it is necessary for a storage component to provide an x at its output to indicate a timing violation, it is not necessary for the component to maintain the x indefinitely. Rather, after a certain number of timing units, the x may be changed to a certain value, such as a logical 1 or a logical 0. By changing the x to a certain value, the present invention makes it possible to meaningfully test the rest of the circuit even when a timing violation is experienced by a storage component.

In accordance with this observation, the present invention simulates the behavior of a storage component as follows. First, a determination is made as to whether a timing violation has occurred for the storage component. This determination is made by the simulation engine by checking the timing requirements specified in the model of the storage component. If one or more timing violations is detected, then an x is reflected at the output of the storage component. This x is maintained at the output of the storage component for a predetermined number of timing units. The simulation engine, recognizing the x as an indication of uncertainty, causes an indication of error to be provided to the designer. The timing violation is thus manifested to the designer.

After the predetermined number of timing units has expired, however, the output of the storage component is changed from x to a certain value, such as a logical 1 or a logical 0. For purposes of the present invention, which value the x is changed to is not that important. What is important is that it is changed to a value that is certain. By changing the output to a certain value, the present invention prevents the x at the output of the storage component from indefinitely propagating to other components in the circuit. This in turn prevents large numbers of x's from appearing in the results provided by the simulation engine to the designer. Instead, values that are certain will appear in the results. Because these values are certain, they can be used by the designer to determine whether the rest of the circuit operated properly.

The present invention provides the best of both worlds. On the one hand, it provides an x at the output of the storage component to enable the simulation engine to manifest a timing violation to the designer. On the other hand, it prevents the x from indefinitely propagating to other components in the circuit, thereby enabling the rest of the circuit to be meaningfully tested. Because it performs the notification function without sacrificing the testing function, and vice versa, the present invention provides a complete solution to the problem posed above.

BRIEF DESCRIPTION OF THE DRAWINGS

FIG. 1 is a logical block diagram of a computer system in which the present invention may be implemented.

FIG. 2 is a primitive, in the form of a truth table, for a storage component in accordance with the present invention.

FIG. 3 is a sample module corresponding to a particular instance of a storage component.

DETAILED DESCRIPTION OF THE EMBODIMENT(s)

Figure 4:
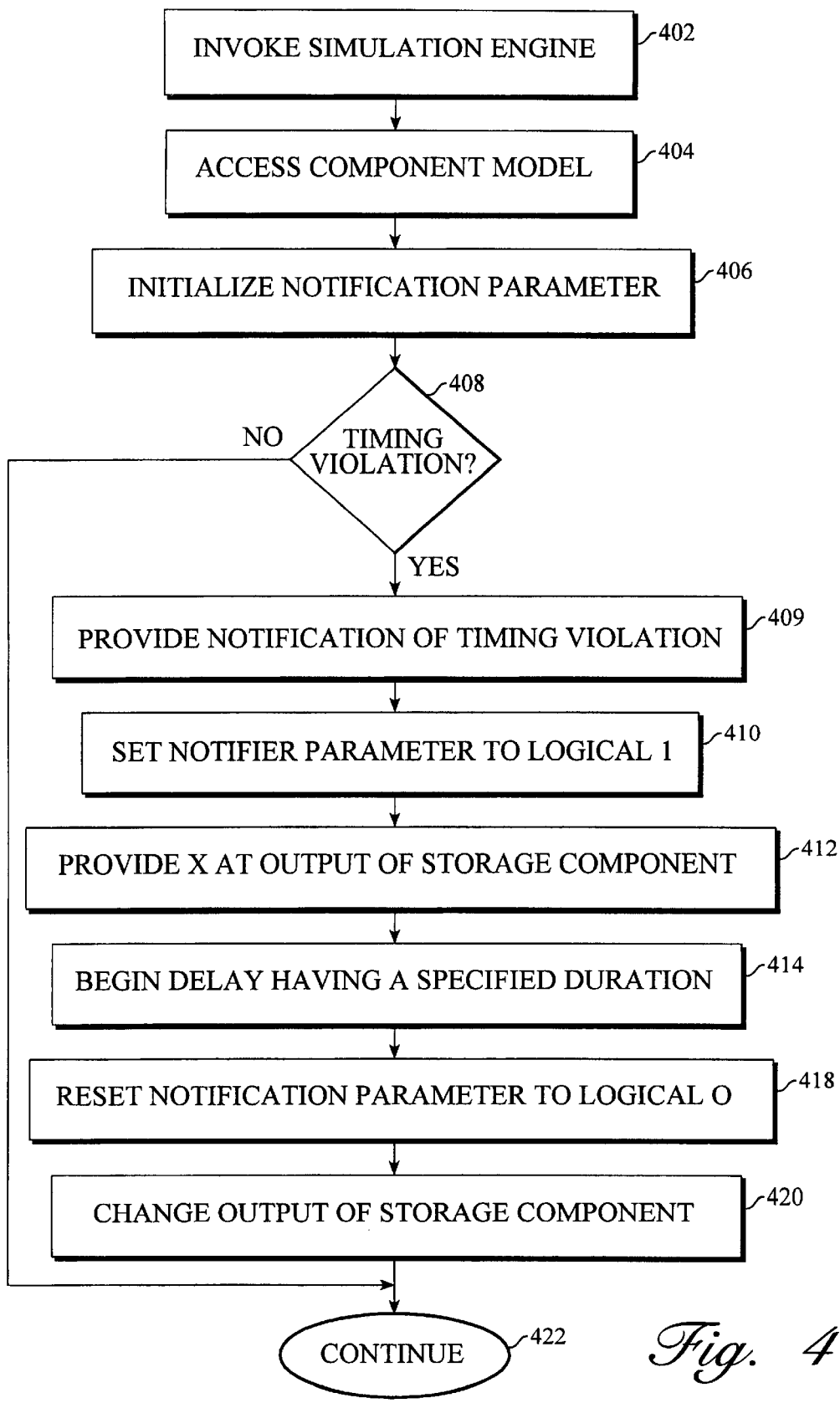
FIG. 4 is a flow diagram illustrating the methodology of the present invention.

With reference to FIG. 1, there is shown a logical block diagram of a computer system 100 in which the present invention may be implemented, the system 100 comprising a software simulation tool 102, a circuit definition 108, and one or more component models 104. In system 100, the circuit definition 108 is provided by the circuit designer, and represents the circuit that is to be tested. The circuit definition 108 specifies all of the components in the circuit, as well as all of the connections between the various components. The circuit definition 108 may be specified using any language or convention that can be interpreted by the simulation tool 102. Depending upon which simulation tool 102 is used, the language or convention may differ, but one language that is commonly used to define circuits is Verilog XL.

In constructing the circuit definition 108, the circuit designer may include references to one or more of the component models 104. These component models 104 may be purchased from third party vendors, or they may be constructed by the circuit designer. Basically, a component model 104 is an entity that defines the specific behavior of a basic component of a circuit, such as an AND gate, an OR gate, a storage component, etc. In addition to specifying the behavior of the basic component, a component model 104 may also set forth special characteristics of a component, such as the timing requirements that must be met in order for the component to operate properly. It is these component models 104 that the simulation tool 102 relies upon to property simulate the behavior of a component.

The behavior and characteristics of a component may be specified in a model in many different ways, but one way that has been found to be efficient involves the use of a hierarchy comprising primitives In 110 and modules 112. In such a hierarchy, the primitive 110 is the basic definition of the component. It contains the core description of the component that applies to all of the components of that type. The module 112, on the other hand, is a higher level construct. It references the primitive 110 and provides additional characteristics pertaining to a particular instance of a component of that type. Multiple modules 112 may reference the same primitive 110.

As an example, for a storage component, the primitive 110 may be a truth table that sets forth the desired behavior of the storage component under all possible circumstances. This truth table applies to all storage components. A module 112, on the other hand, may be a construct that references the truth table and that specifies the specific timing requirements for a particular storage component. Since these timing requirements are specific to the particular storage component, they should not and do not apply to other storage components. For another storage component having different timing requirements, another module 112 may be constructed which also references the primitive 110 but which sets forth a different set of timing requirements. In this manner, different modules may be constructed for different instances of storage components, all of which reference the same storage component primitive 100. Defining models in this manner is efficient because it prevents the primitive 110 from having to be replicated in each module 112. By referencing and interconnecting the various component models 104, the designer can construct a circuit definition for the circuit that he is testing.

Once the circuit definition 108 is constructed, the designer invokes the simulation engine 106 of the software simulation tool 102 to interpret the circuit definition 108, and to simulate the behavior of the circuit. Simulation tools 102 of this type are commercially available from various vendors, one of which is Cadence Design Systems, Inc. of San Jose, Calif. In performing this function, the simulation engine 106 references the component models 104, and simulates the behavior of the components in accordance with the models 104. The end result of this process is a set to of results/outputs that the designer can use to determine whether the circuit operated as intended. In this manner, the circuit is tested and verified.

With simulation tools, the results are only as good as the models used to represent the circuit components. If the models are flawed, the results will also be flawed. Because of this, it is imperative that the components be modeled accurately. The present invention provides an improved model for storage components. Used in this context, the term storage component refers to any component that is capable of storing one or more bits of data, including but not limited to a flip-flop, a latch, a register, a random access memory (RAM), and a read only memory (ROM). An embodiment of this improved model is shown in FIGS. 2 and 3. Specifically, FIG. 2 shows the primitive 110, in the form of a truth table 110, for the storage component, while FIG. 3 shows a sample module 112, written in Verilog XL, which references the primitive 110.

Referring first to FIG. 2, the truth table 110 sets forth the basic behavior of the storage component. The storage component has five parameters which represent actual inputs/outputs. These are:

d=data input;
cp=clock signal;
r=reset signal;

s=set signal; and qt=data output.

The storage component also has two other parameters which are used for simulation purposes. These are:

no=notifier parameter; and qt+1=the next data output of the storage component.

The truth table 110 sets forth the behavior of the storage component under various combinations of states of these parameters. For the most part, the truth table 110 is self-explanatory. However, certain symbols and parameters referenced in the truth table 110 may need to be clarified. Specifically, as used in the truth table 110:

(1) the "?" indicates a "don't care" condition;

(2) the "*" refers to any transition from any state to any other state;

(3) the "x" indicates uncertainty; and (4) the "( )" indicate a transition from one state to another; for example, (01) refers to a transition from a logical 0 to a logical 1, while (10) refers to a transition from a logical 1 to a logical 0.

As to the parameters, all are self explanatory except perhaps for the notifier parameter (no). As used in the truth table 110, the notifier is the parameter that indicates whether a timing violation has been detected for the storage component. If a timing violation has been detected, then the notifier is set to logical 1. Otherwise, the notifier is set to logical 0. Note that the notifier parameter is not an actual input or output of the storage component. Rather, it is a parameter that is used only for simulation purposes.

The state of the notifier parameter determines whether or not an x is provided at the output of the storage component. Specifically, note that according to the truth table 110, an x is provided at the next data output (qt+1) of the storage component only when the notifier is set to logical 1. When the notifier is at logical 0, x never appears at the next data output. The only other time that x appears at the next data output of the storage component is when x appears at the data input (d) of the storage component and the notifier is making a transition from a logical 1 to a logical 0. This is a very special case. At all other times, the storage component does not output an x. As this discussion shows, the notifier parameter is the key to controlling the appearance of an x at the output of the storage component.

Referring now to FIG. 3, there is shown a sample module 112, written in Verilog XL, which references the primitive 110 of FIG. 2. This module 112 sets forth additional characteristics pertaining to a particular instance of the storage component. Together, the primitive 110 and the module 112 form a model of a particular instance of the storage component. As shown in FIG. 3, the module 112 is divided into several sections. Section A may be viewed as the declaration section. It is in this section that the actual inputs and outputs of this instance of the storage component are declared, and it is here that the connectivity between the inputs and outputs of the module 112 and the inputs and outputs of the primitive 110 is specified.

Section B is the section that sets forth statements for controlling the behavior of the storage component. In this embodiment, section B contains two portions: B1 and B2. Portion B1 is the initialization portion which is responsible for initializing the notifier parameter to logical 0 before any timing checks are performed. Portion B2 is the portion which is responsible for resetting the notifier back to logical 0 after the notifier has been changed to a logical 1. More specifically, portion B2 specifies that whenever the notifier parameter makes a transition from a logical 0 to a logical 1, a delay of a certain duration is started. While the delay is in effect, the notifier parameter is maintained at logical 1. Once the delay duration expires, however, the notifier parameter is reset to logical 0. In the embodiment shown, the delay is set to 4 timing units; however, it should be noted the delay may be set to any desired duration. Portions B1 and B2 play important roles in the implementation of the present invention. This will be made clear in a later section.

Section C of the module 112 is the timing check section. It is here that the specific timing requirements for this instance of the storage component are specified. It is also in section C that the timing checks that need to be performed for the storage component are set forth. The simulation engine 106 will perform the checks specified in section C to determine whether a timing violation has occurred for the storage component. A point to note regarding section C is that in each of the timing check statements, one of the parameters that is passed as an argument is the notifier parameter. This enables the simulation engine 106 to set the notifier parameter to a logical 1 whenever a timing violation is detected.

With reference to the flow diagram of FIG. 4, the use of the model in a simulation sequence will now be described. As shown in FIG. 4, the simulation sequence begins with the designer invoking (step 402) the simulation engine 106 of the simulation tool 104, and directing it towards the circuit definition 108 constructed by the designer. This causes the simulation engine 106 to begin interpreting the circuit definition 108. For purposes of this discussion, it will be assumed that the circuit definition 108 contains a reference to the storage component module 112 of FIG. 3, so that the engine 106 accesses (step 404) and begins to interpret the module 112. Upon interpreting the module 112, the engine 106 ascertains from section A that the module 112 is referencing the storage component primitive 110 of FIG. 3. Based upon this, the engine 106 knows that when it comes time to determine the behavior of the storage component, it needs to consult the truth table 110.

After interpreting section A, the engine 106 proceeds to section B to carry out the instructions contained therein. Specifically, the engine 106, in response to portion B1 of section B, initializes (step 406) the notifier parameter to logical 0. The engine 106 then proceeds to carry out the instructions of portion B2. Portion B2 specifies that, if the notifier parameter is making a transition from a logical 0 to a logical 1, then delay 4 timing units and reset the notifier parameter back to logical 0. Since the notifier is not making any 0 to 1 transition at this point, the engine 106 does not perform any actions in response to portion B2.

Thereafter, the engine 106 proceeds to section C of the module 112 to check for timing violations. In performing this function, the engine 106 performs each of the applicable timing checks specified in section C. If the engine 106 determines (step 408) that no timing violations have occurred, then it proceeds to step 422 to simply continue the simulation. On the other hand, if one or more timing violations are detected, then the engine 106 provides (step 409) notification of the timing violation to the designer, and sets (step 410) the notifier parameter to a logical 1.

The setting of the notifier parameter gives rise to two consequences. First, because it represents a change in state in one of the parameters of the storage component, it causes the engine 106 to consult the truth table 110 to determine the proper behavior for the storage component. According to the truth table 110, when the notifier parameter is set to logical 1, the next output of the storage component is an x. Accordingly, the engine 106 sets (step 412) the output of the storage component to x. Second, because the setting of the notifier parameter involves a transition from a logical 0 to a logical 1, the instruction of portion B2 is triggered. As a result, the engine 106 begins (step 414) a delay of 4 timing units. During this delay, the notifier parameter is maintained at 1, which means that the output of the storage component is also maintained at x. Effectively, this delay causes the x output to be maintained for 4 timing units. In this embodiment, the delay is set to 4 timing units; however, it should be noted that the delay may be set to any duration. Optimally, the delay duration should be chosen such that it manifests the x output to the designer for a sufficient period of time. Maintaining the x output in this manner also may help to expose other possible errors in the circuit.

After the specified number of timing units has elapsed, the engine 106, in accordance with the instruction of portion B2, resets (step 418) the notification parameter to logical 0. Because this represents a change in state in one of the parameters of the storage component, it causes the engine 106 to consult the truth table 110 again to determine the proper behavior for the storage component. According to the truth table 110, when the notifier parameter is making a transition from a logical 1 to a logical 0, the next output of the storage component is dependent upon the state of the data input (d). Specifically: (1) if the data input is a logical 1, the next output of the storage component is set to logical 1; (2) if the data input is a logical 0, the next output of the storage component is set to logical 0; and (3) if the data input is x, the next output of the storage component is set to x. Unless the data input is an x (which is a rare case), the engine 106 changes (step 420) the output of the storage component from an x to a value that is certain (either a 1 or a 0). By doing so, the engine 106 removes the uncertainty from the storage component output and prevents it from indefinitely propagating to other components. This, in turn, makes it possible to meaningfully test the other components in the circuit. After changing the output to a certain value, the engine 106 proceeds to step 422 to continue the simulation (e.g. simulate other components). The model of the present invention is thus used in a simulation.

The present invention provides the best of both worlds. On the one hand, it provides an x at the output of the storage component to enable the simulation engine to manifest a timing violation to the designer. On the other hand, it prevents the x from indefinitely propagating to other components in the circuit, thereby enabling the rest of the circuit to be meaningfully tested. Because it performs the notification function without sacrificing the testing function, and vice versa, the present invention provides a complete solution.

Thus far, the basic model of the storage component has been discussed. As enhancements, the following considerations may be added:

(1) if both the data input (d) and the current data output (qt) of the storage component have a value of logical 1, then the engine may forego the timing violation check between the clock signal (cp) and the set signal (s);

(2) if both the data input (d) and the current data output (qt) of the storage component have a value of logical 0, then the engine may forego the timing violation check between the clock signal (cp) and the reset signal (r);

(3) if the storage component has an "enable" input, and if both the data input (d) and the current data output (qt) of the storage component have the same value, then the engine may forego the timing violation check between the clock signal (cp) and the enable signal; and (4) if the storage component has an "enable" input, and if the enable signal has a value of logical 0, then the engine may forego the timing violation check between the clock signal (cp) and the data output for the storage component.

These and other enhancements may be made without departing from the spirit of the present invention.

Figure 5:
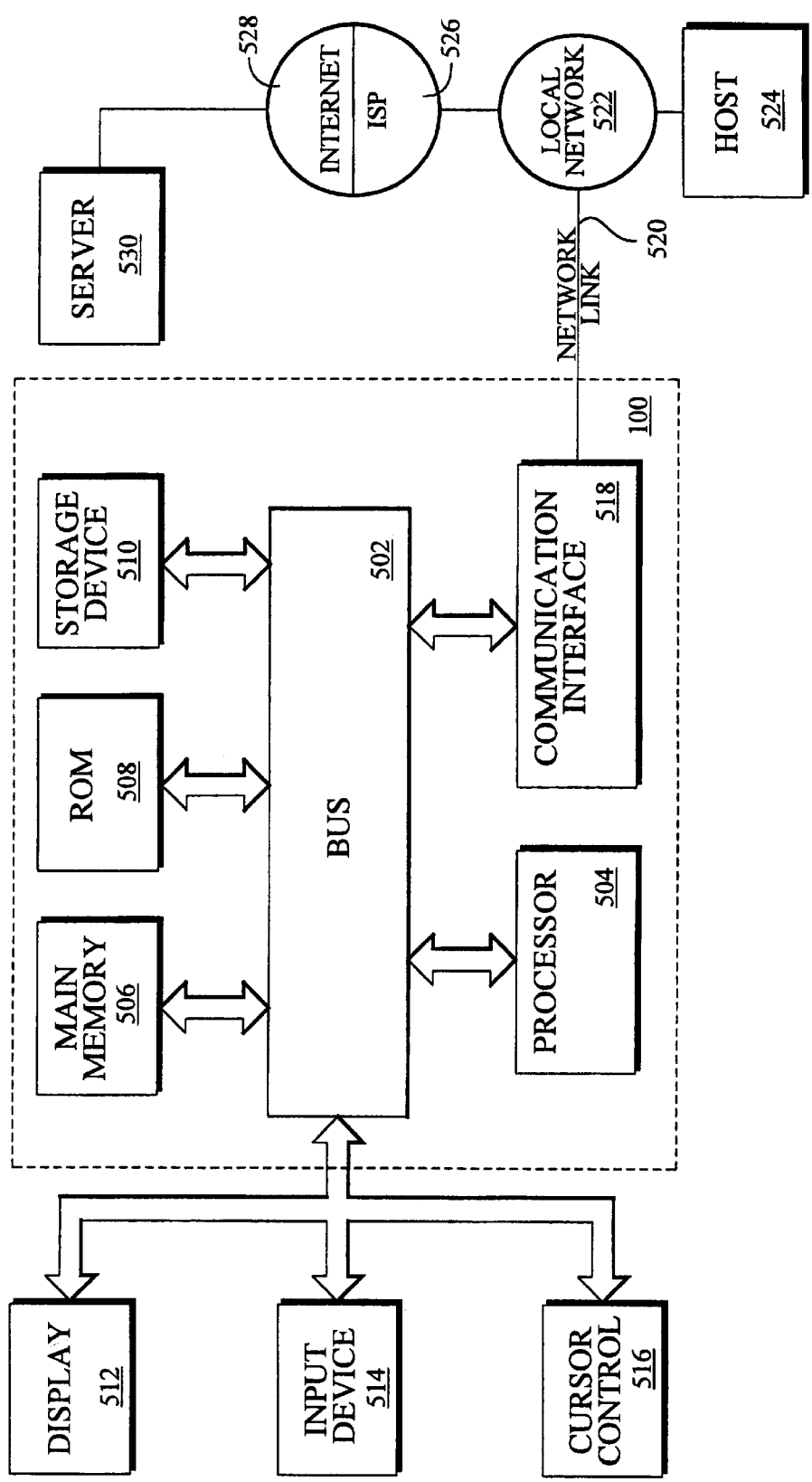
FIG. 5 is a block diagram of a physical computer system on which the present invention may be implemented.

FIG. 5 is a block diagram illustrating a possible physical embodiment of the computer system 100 (FIG. 1) with which the present invention may be implemented. Computer system 100 includes a bus 502 or other communication mechanism for communicating information, and a processor 504 coupled with bus 502 for processing information. Computer system 100 also includes a main memory 506, such as a random access memory (RAM) or other dynamic storage device, coupled to bus 502 for storing information and instructions by processor 504. Main memory 506 also may be used for storing temporary variables or other intermediate information during execution of instructions to be executed by processor 504. Computer system 100 further includes a read only memory (ROM) 508 or other static storage device coupled to bus 502 for storing static information and instructions for processor 504. A storage device 510, such as a magnetic disk or optical disk, is provided and coupled to bus 502 for storing information and instructions.

Computer system 100 may be coupled via bus 502 to a display 512, such as a cathode ray tube (CRT), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

According to one embodiment, the functionality of the present invention is provided by computer system 100 in response to processor 504 executing one or more sequences of one or more instructions contained in main memory 506. Such instructions may be read into main memory 506 from another computer-readable medium, such as storage device 510. Execution of the sequences of instructions contained in main memory 506 causes processor 504 to perform the process steps described herein. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 504 for execution. Such a medium may take many forms, including but not limited to, non-volatile media, volatile media, and transmission media. Non-volatile media includes, for example, optical or magnetic disks, such as storage device 510. Volatile media includes dynamic memory, such as main memory 506. Transmission media includes coaxial cables, copper wire and fiber optics, including the wires that comprise bus 502. Transmission media can also take the form of acoustic or electromagnetic waves, such as those generated during radio-wave, infra-red, and optical data communications.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 504 for execution. For example, the instructions may initially be carried on a magnetic disk of a remote computer. The remote computer can load the instructions into its dynamic memory and send the instructions over a telephone line using a modem. A modem local to computer system 100 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Computer system 100 also includes a communication interface 518 coupled to bus 502. Communication interface 518 provides a two-way data communication coupling to a network link 520 that is connected to a local network 522. For example, communication interface 518 may be an integrated services digital network (ISDN) card or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the world wide packet data communication network now commonly referred to as the "Internet" 528. Local network 522 and Internet 528 both use electrical, electromagnetic or optical signals that carry digital data streams. The signals through the various networks and the signals on network link 520 and through communication interface 518, which carry the digital data to and from computer system 100, are exemplary forms of carrier waves transporting the information.

Computer system 100 can send messages and receive data, including program code, through the network(s), network link 520 and communication interface 518. In the Internet example, a server 530 might transmit a requested code for an application program through Internet 528, ISP 526, local network 522 and communication interface 518. The received code may be executed by processor 504 as it is received, and/or stored in storage device 510, or other non-volatile storage for later execution. In this manner, computer system 100 may obtain application code in the form of a carrier wave.

At this point, it should be noted that although the invention has been described with reference to specific embodiments, it should not be construed to be so limited. Various modifications can be made by those of ordinary skill in the art with the benefit of this disclosure without departing from the spirit of the invention. Thus, the invention should not be limited by the specific embodiments used to illustrate it but only by the scope of the appended claims.

What is claimed is:

1. A computer implemented method for simulating a storage component, comprising:

determining whether one or more timing violations has occurred for the storage component;

in response to a determination that one or more timing violations has occurred for the storage component, providing an uncertainty indicator at an output of the storage component; and after a selected number of timing units has occurred, replacing the uncertainty indicator next issued at the output by a non-random output value determined by a storage component data input value for a selected time immediately preceding issuance of the non-random output value, wherein the non-random value at the output is determined by a procedure comprising the following: where the data input value is a logical 0, the next non-random output value is a logical 0, and where the data input value is a logical 1, the next non-random output value is a logical 1.

2. The method of claim 1, further comprising choosing said selected number of timing units to be sufficiently large such that said uncertainty indicator is maintained for a sufficient period of time to manifest a timing violation.

3. The method of claim 1, further comprising providing said uncertainty indicator by setting a timing violation notifier parameter equal to a selected notifier value.

4. The method of claim 3, wherein said uncertainty indicator is replaced by said non-random value by resetting said timing violation notifier parameter to a second selected notifier value.

5. The method of claim 1, wherein said storage component receives an input data signal, a clock signal, and a set signal, and wherein the act of determining whether one or more timing violations has occurred for said storage component comprises:

determining whether the input data signal and said output of said storage component both have a current value of logical 1; and when the input data signal and said output of said storage component both have a current value of logical 1, foregoing a timing violation check between the clock signal and the set signal.

6. The method of claim 1, wherein said storage component receives an input data signal, a clock signal, and a set signal, and wherein the act of determining whether one or more timing violations has occurred for said storage component comprises:

determining whether the input data signal and said output of said storage component both have a current value of logical 0; and when the input data signal and said output of said storage component both have a current value of logical 0, foregoing a timing violation check between the clock signal and the set signal.

7. The method of claim 1, wherein said storage component receives an input data signal, a clock signal, and an enable signal, and wherein the act of determining whether one or more timing violations has occurred for said storage component comprises:

determining whether the input data signal and said output of said storage component both currently have the same logical value; and when the input data signal and said output of said storage component both currently have the same logical value, foregoing a timing violation check between the clock signal and the enable signal.

8. The method of claim 1, wherein said storage component receives an input data signal, a clock signal, and an enable signal, and wherein the act of determining whether one or more timing violations has occurred for said storage component comprises:

determining whether the enable signal has a current value of logical 0; and when the enable signal has a current value of logical 0, foregoing a timing violation check between the clock signal and said output of said storage component.

9. An apparatus for simulating a storage component, comprising:

a timing check mechanism for determining whether one or or timing violations has occurred for the storage component;

an indicator mechanism for providing, in response to a determination that one or more timing violations has occurred for the storage component, an uncertainty indicator at an output of the storage component; and a timing mechanism for causing, after a selected number of timing units has occurred, the uncertainty indicator next issued at the output of the storage component to be replaced by a non-random output value, determined by a storage component data input value for a selected time immediately preceding issuance of the non-random output value, wherein the timing mechanism determines the non-random value at the output by a procedure comprising the following: where the data input value is a logical 0, the next non-random output value is a logical 0, and where the data input value is a logical 1, the next non-random output value is a logical 1.

10. The apparatus of claim 9, wherein said selected number of timing units is sufficiently large such that said uncertainty indicator is maintained for a sufficient period of time to manifest a timing violation.

11. The apparatus of claim 9, wherein said indicator mechanism comprises a notifier value mechanism for setting a timing violation notifier parameter equal to a selected notifier value.

12. The apparatus of claim 11, wherein said notifier value mechanism resets said timing violation notifier parameter after said occurrence of said selected number of timing units.

13. The method of claim 9, wherein said storage component receives an input data signal, a clock signal, and a set signal, and wherein said timing check mechanism comprises:

a data check mechanism for determining whether the input data signal and said output of said storage component both have a current value of logical 1 and, when the input data signal and said output of said storage component both have a current value of logical 1, for foregoing a timing violation check between the clock signal and the set signal.

14. The method of claim 9, wherein said storage component receives an input data signal, a clock signal, and a set signal, and wherein said timing check mechanism comprises:

a data check mechanism for determining whether the input data signal and said output of said storage component both have a current value of logical 0 and, when the input data signal and said output of said storage component both have a current value of logical 0, for foregoing a timing violation check between the clock signal and the set signal.

15. The method of claim 9, wherein said storage component receives an input data signal, a clock signal, and an enable signal, and wherein said timing check mechanism comprises:

a data check mechanism for determining whether the input data signal and said output of said storage component both currently have the same logical value and, when the input data signal and said output of said storage component both currently have the same logical value, for foregoing a timing violation check between the clock signal and the enable signal.

16. The method of claim 9, wherein said storage component recieves an input data signal, and an enable signal, and wherein said timing check mechanism comprises:

an enable check mechanism for determining whether the enable signal has a current value of 0 and, when the enable signal has a current value of logical 0, for foregoing a timing violation check between the clock signal and said output of said storage component.

\* \* \* \* \*